United States Patent [19]
Tran

[11] Patent Number: 6,023,428
[45] Date of Patent: Feb. 8, 2000

[54] INTEGRATED CIRCUIT DEVICE HAVING A MEMORY ARRAY WITH SEGMENTED BIT LINES AND METHOD OF OPERATION

[75] Inventor: Hiep Van Tran, Dallas, Tex.

[73] Assignee: Texas Instruments Incorporated, Dallas, Tex.

[21] Appl. No.: 09/123,591

[22] Filed: Jul. 28, 1998

Related U.S. Application Data

[60] Provisional application No. 60/053,920, Jul. 28, 1997.

[51] Int. Cl.[7] .................................................. G11C 16/04
[52] U.S. Cl. ............................... 365/189.01; 365/230.03; 365/189.04
[58] Field of Search ...................... 371/21.3; 365/189.01, 365/185.21, 196, 230.03, 230.04, 230.05, 207, 189.06, 189.04

[56] References Cited

U.S. PATENT DOCUMENTS

| | | | |
|---|---|---|---|
| 4,704,705 | 11/1987 | Womack | 365/149 |
| 4,868,823 | 9/1989 | White, Jr. et al. | 371/21.3 |
| 4,873,672 | 10/1989 | Etoh et al. | 365/218 |
| 4,991,139 | 2/1991 | Takahashi et al. | 365/201 |
| 5,023,837 | 6/1991 | Schreck et al. | 365/185 |
| 5,325,332 | 6/1994 | Tagaya | 365/200 |
| 5,650,972 | 7/1997 | Tomishima et al. | 365/207 |
| 5,831,924 | 11/1998 | Nitta et al. | 365/230.03 |

*Primary Examiner*—Trong Phan
*Assistant Examiner*—Thong Le
*Attorney, Agent, or Firm*—Robby T. Holland; Richard L. Donaldson

[57] ABSTRACT

An integrated circuit device having a memory array (50) with segmented bit lines and a method of operation are disclosed. A sub array (52) of the memory array (50) can be operated as a multiple port sub array. A bit line of the sub array (52) is separated into bit line segments by disconnecting the bit line segments (54) from one another. A first bank of sense amplifiers (58) is connected to a first bit line segment (54) of the sub array (52), and a second bank of sense amplifiers (58) is connected to a second bit line segment (54) of the sub array (52). A first operation is performed to the first bit line segment (54) using the first bank of sense amplifiers (58), and a second operation is concurrently performed to the second bit line segment (54) using the second bank of sense amplifiers (58).

47 Claims, 4 Drawing Sheets

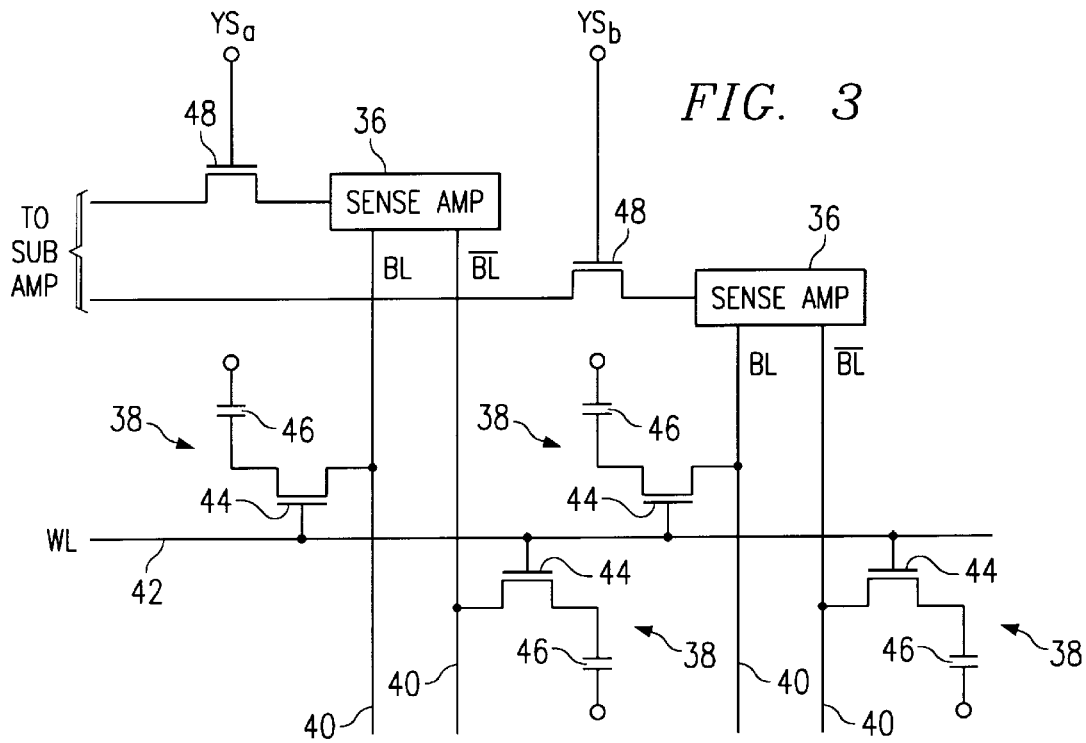

| NORMAL OPERATION | | DP | A | B | X | Y | MAIN AMP | MAIN AMP(DP) |
|---|---|---|---|---|---|---|---|---|
| READ OR WRITE TO ①,②,③ | | L | L | L | H | H | RD or WR | - |
| DUAL PORT OPERATION | | DP | A | B | X | Y | MAIN AMP | MAIN AMP(DP) |
| ODD SUB ARRAY | READ ①/WRITE ②,③ | H | H | L | L | H | RD | WR |
| | READ ①,②/WRITE ③ | H | H | L | H | L | RD | WR |
| | WRITE ①/READ ②,③ | H | H | L | L | H | WR | RD |
| | WRITE ①,②/READ ③ | H | H | L | H | L | WR | RD |
| EVEN SUB ARRAY | READ ①/WRITE ②,③ | H | L | H | L | H | WR | RD |
| | READ ①,②/WRITE ③ | H | L | H | H | L | WR | RD |
| | WRITE ①/READ ②,③ | H | L | H | L | H | RD | WR |
| | WRITE ①,②/READ ③ | H | L | H | H | L | RD | WR |

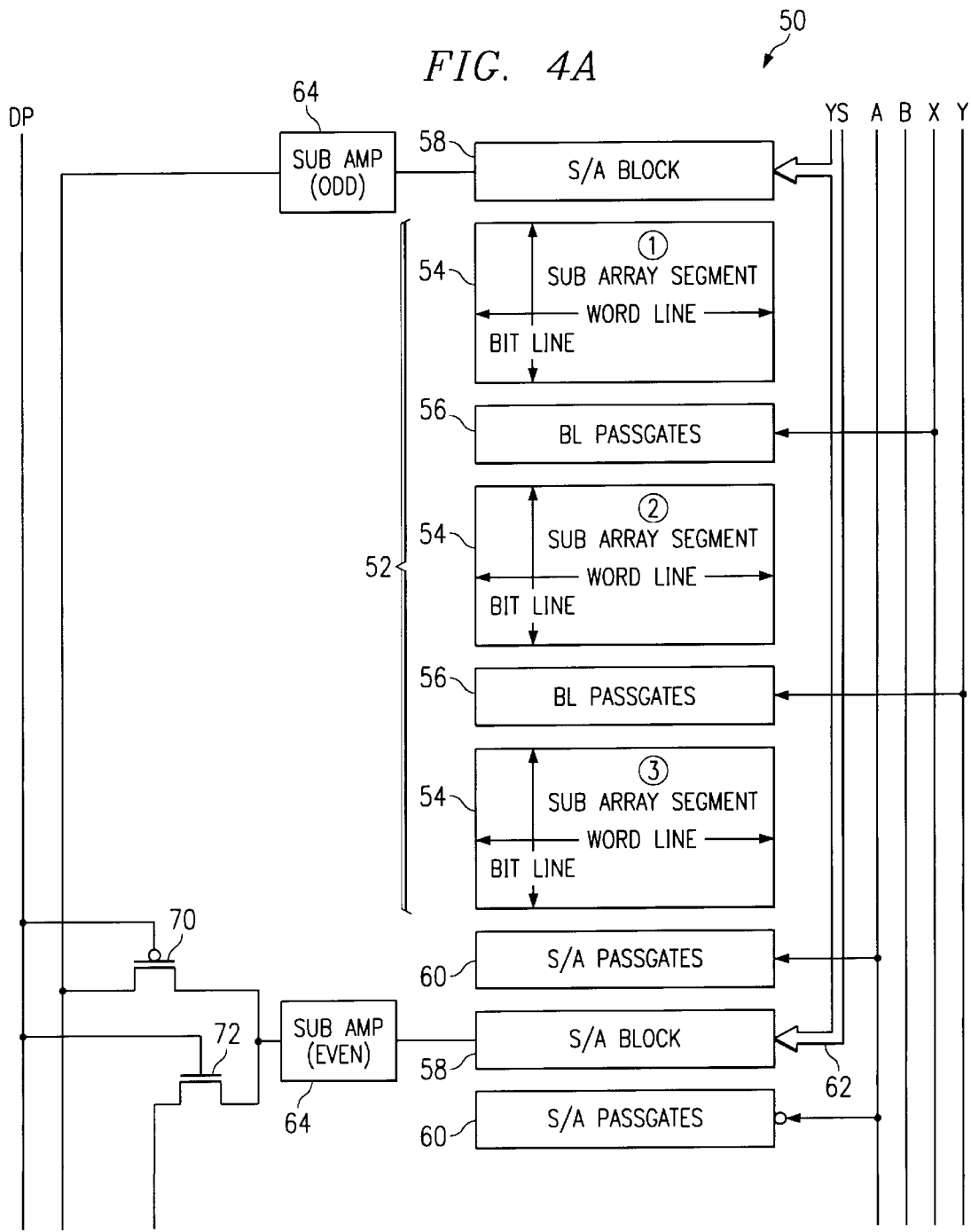

INTEGRATED CIRCUIT DEVICE HAVING A MEMORY ARRAY WITH SEGMENTED BIT LINES AND METHOD OF OPERATION

This is a Non Provisional application filed under 35 USC 119(e) and claims priority of prior provisional, Ser. No. 60/053,920 of inventor Hiep Van Tran, filed Jul. 28, 1997.

TECHNICAL FIELD OF THE INVENTION

This invention relates in general to the field of integrated circuit devices, and more particularly to an integrated circuit device having a memory array with segmented bit lines and a method of operation.

BACKGROUND OF THE INVENTION

Memory arrays are widely used on integrated circuit devices to provide operating memory for various functionality. Such integrated circuit devices include dynamic random access memory (DRAM) and synchronous random access memory (SRAM). In addition, other types of integrated circuit devices, such as processors, controllers and application specific integrated circuits (ASIC), include memory arrays that provide imbedded work space. With respect to DRAM devices, memory arrays are typically single port arrays. This means that each sub array within the memory array can be read from or written to only once during each clock cycle. Because it is advantageous to increase the speed with which data can be written to and read from the memory array, some conventional memory arrays have dual port or multi-port sub arrays.

One conventional method for providing dual port functionality in the memory sub array is to change the memory cell structure to allow dual access to the data stored therein. Further, memory architectures have added bit lines to the bit line scheme to allow two paths of access. However, these dual port methods suffer from the effect that the memory array is changed significantly with respect to the layout for a single port function. Consequently, memory cell density can be affected as well as other operating characteristics.

SUMMARY OF THE INVENTION

In accordance with the present invention, an integrated circuit device having a memory array with segmented bit lines and a method of operation are provided that provide advantages over conventional memory arrays and that allow multiple port functionality without significantly affecting the layout of the memory cells.

According to one aspect of the present invention an integrated circuit device having a memory array with segmented bit lines and a method of operation are disclosed. A sub array of the memory array can be operated as a multiple port sub array. A bit line of the sub array is separated into bit line segments by disconnecting the bit line segments from one another. A first bank of sense amplifiers is connected to a first bit line segment of the sub array, and a second bank of sense amplifiers is connected to a second bit line segment of the sub array. A first operation is performed to the first bit line segment using the first bank of sense amplifiers, and a second operation is concurrently performed to the second bit line segment using the second bank of sense amplifiers.

According to another aspect of the present invention, a memory sub array is disclosed. The sub array has a plurality of memory cells selected by column select lines and row select lines where the selected memory cells coupled to data terminals through bit lines and banks of sense amplifiers. The sub array includes a plurality of sub array segments where each sub array segment contains one of a plurality of bit line segments. The sub array also includes a bank of controllable connections coupled between the bit line segments of each sub array segment. The controllable connections operate to connect or disconnect adjacent bit line segments responsive to control signals. Each bank of controllable connections thereby allows the sub array to function in a dual port mode by allowing concurrent access to disconnected bit line segments of the sub array.

A technical advantage of the present invention is the provision of multi-port functionality within a memory array without significantly altering the memory array from a single port layout. In one embodiment, the present invention provides dual port functionality such that two read or write operations can be executed to the same sub array at the same time. The memory array can function in a conventional single port mode, as well. The benefits of the present invention are, in part, accomplished through the use of multiple sense amplifier banks positioned adjacent to the sub array and by segmenting the bit lines. The advantages of the present invention can be applied to any memory array within an integrated circuit device, including DRAM, SRAM, processors, controllers, ASIC, and other integrated circuit devices.

BRIEF DESCRIPTION OF THE DRAWINGS

A more complete understanding of the present invention and advantages thereof may be acquired by referring to the following description taken in conjunction with the accompanying drawings in which like reference numbers indicate like features and wherein:

FIG. 3 is a block diagram of one embodiment of memory cells within the sub arrays of FIG. 2;

FIGS. 4A and 4B are a block diagram of one embodiment of a memory array having segmented bit lines according to the teachings of the present invention; and FIG. 5 is a chart of one embodiment of operation modes of the memory array having segmented bit lines of FIGS. 4A and 4B.

DETAILED DESCRIPTION OF THE INVENTION

Figure 1:
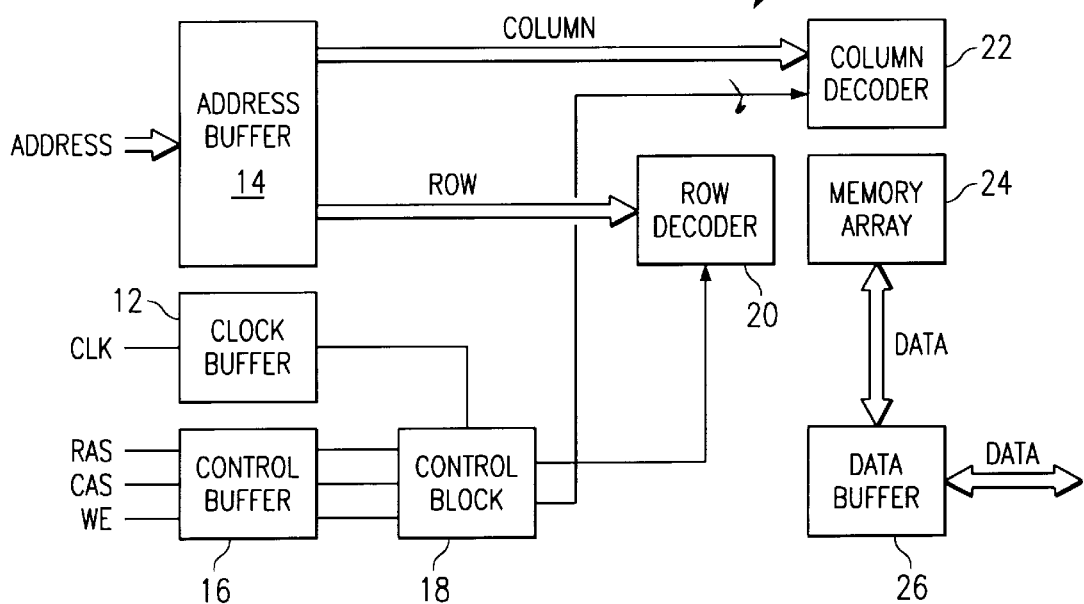
FIG. 1 is a block diagram of one embodiment of a conventional integrated circuit memory device.

FIG. 1 is a block diagram of one embodiment of an integrated circuit memory device, indicated generally at 10. In the embodiment of FIG. 1, memory device 10 is a DRAM device, however, that there are numerous forms of memory devices and integrated circuits with embedded memory arrays. Memory device 10 of FIG. 1 receives clock, control, address and data signals (CLK, RAS, CAS, WE, ADDRESS and DATA) and functions as a DRAM memory device in a conventional manner.

As shown in FIG. 1, memory device 10 can include a clock buffer 12 which receives the clock signal, CLK. An address buffer 14 receives address data, ADDRESS, and a control buffer 16 receives control signals RAS, CAS and WE. A main control block 18 then receives a clock signal from clock buffer 12 as well as control signals from control buffer 16. Address buffer 14 provides address data to a row decoder 20 and a column decoder 22. Row decoder 20 and column decoder 22 also receive control signals from control block 18. Row decoder 20 and column decoder 22 are associated with a memory array 24 which contains a plurality of sub arrays each comprising a plurality of memory cells. Data from memory array 24 is provided to a data buffer 26 which in turn provides data to terminals of memory device 10. Incoming data is also provided to memory array 24 through the path through data buffer 26. In general, memory device 10 of FIG. 1 operates to store data within memory array 24 and to allow data to be read from memory array 24.

Figure 2:
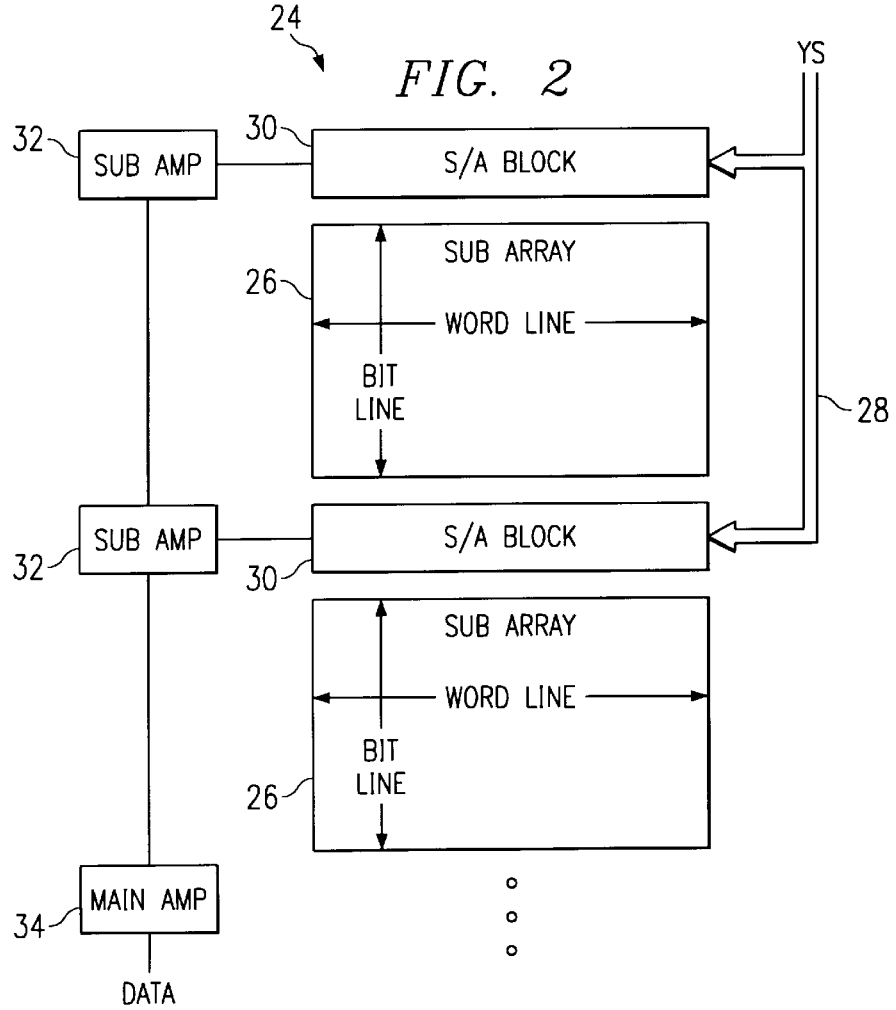
FIG. 2 is a block diagram of one embodiment of sub arrays within the integrated circuit memory device of FIG. 1.

FIG. 2 is a block diagram of one embodiment of sub arrays within memory array 24 of FIG. 1. FIG. 2 generally illustrates one embodiment of an input/output (I/O) data path for memory array 24. As shown, memory array 24 includes a number of memory sub arrays 26 that each contain a plurality of memory cells. The memory cells within each sub array 26 are connected to bit lines and word lines formed within sub array 26. Memory array 24 further includes a plurality of column select lines (YS) 28 which are used to select a particular column within sub arrays 26. The bit lines within each sub array 26 are connected to sense amplifiers within respective sense amplifier blocks 30. The sense amplifiers within sense amplifier block 30 are connected to respective sub-amplifiers 32 by operation of the column select lines 28. Sub-amplifiers 32 in turn feed a main amplifier 34 which can provide output data for memory array 24.

In a read operation, one row of memory cells in memory array 24 is selected by activating a word line. Data is then sensed in sense amplifiers in the associated sense amplifier block 30 for that row. To read data from memory array 24, a signal can be asserted to activate sub-amplifier 32 for the active sense amplifiers. Then, a column select line 28 for a particular column address can be asserted to connect addressed sense amplifiers to the associated sub-amplifier 32. Data is then transferred from the sense amplifiers to the associated sub-amplifier 32 and on to main amplifier 34. Main amplifier 34 typically is positioned on the ends of memory array 24 and then provides data output for the memory array.

In a write operation, data can be asserted to main amplifier 34. A write enable (WE) signal can then be asserted to connect main amplifier 34 through sub-amplifiers 32 to sense amplifier blocks 30. A column select line 28 can be asserted to connect data directly to an appropriate sense amplifier which then provides the data to the appropriate memory cell.

The architecture of FIG. 2 can be referred to as a single port architecture because during any given cycle, only one operation can be performed on the sub arrays 26. Memory array 24 is typically organized with a number of columns of sub arrays like that shown in FIG. 2. Using these columns, memory array 24 provides a plurality of output data bits or allows writing a plurality of input data bits to memory cells in each cycle.

FIG. 3 is a block diagram of one embodiment of memory cells within a sub array 26 of FIG. 2. As shown, sense amplifiers 36 are coupled to associated memory cells 38 by bit lines 40. Further, each memory cell 38 is connected to a word line 42. Each memory cell comprises a transistor 44 having a gate connected to word line 42, a source connected to a bit line 40 and a drain connected to a storage cell capacitor 46. Each sense amplifier 36 provides an output that is connected to a transistor 48 which is controlled by an associated column select line ($YS_a$, $YS_b$).

To read data stored at a memory cell 38, word line 42 is asserted as well as an associated column select line. The assertion of word line 42 turns on transistor 44 within each connected memory cell 38. Data stored on the memory cells 38 within capacitors 46 is then sensed by sense amplifiers 36. Each sense amplifier 36 provides an output reflecting the data state of its associated memory cell. The selected cell is addressed by asserting the appropriate column select line and data is provided to the associated sub-amplifier.

Figure 4B:
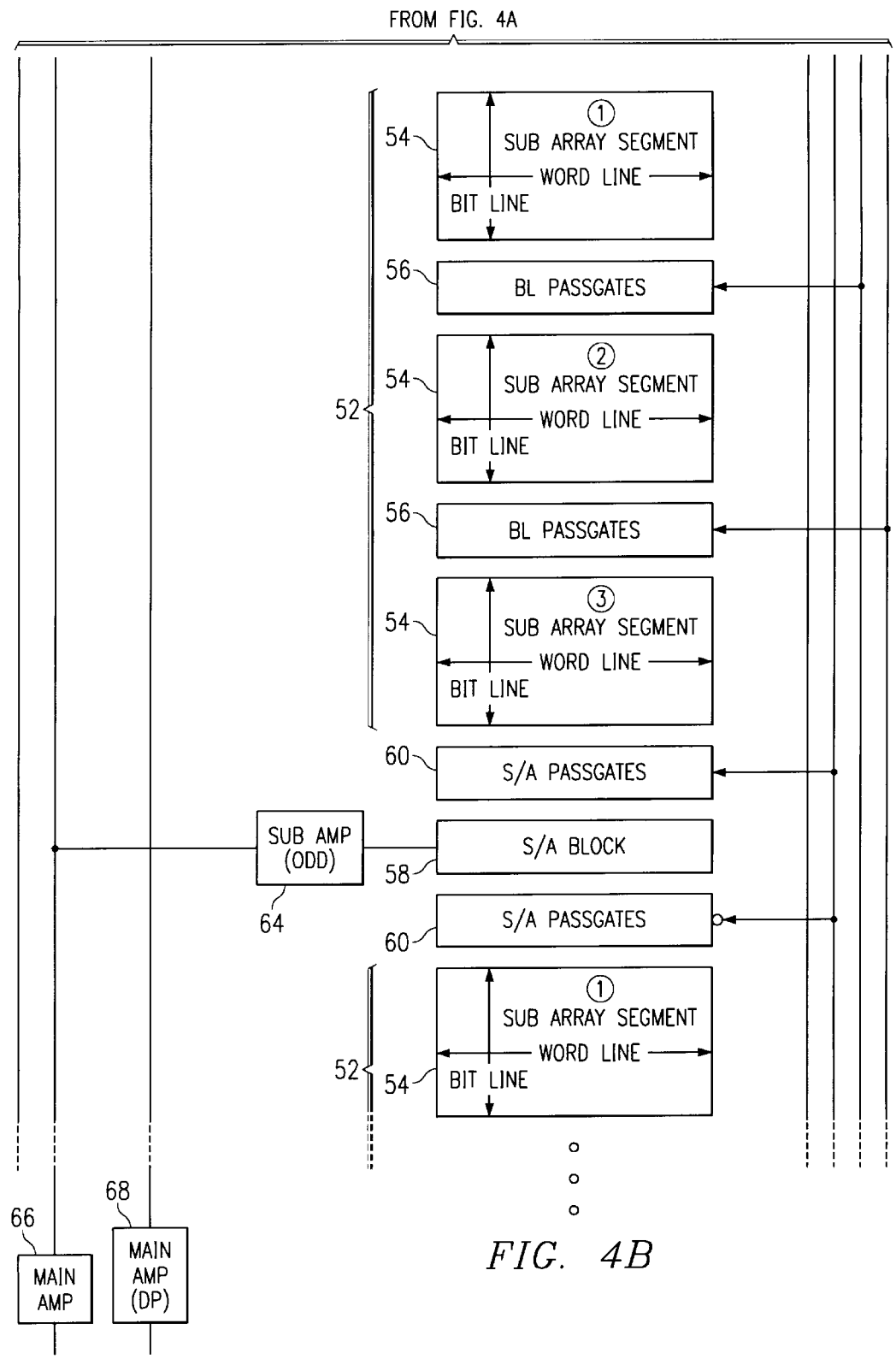

FIGS. 4A and 4B are a block diagram of a memory array having segmented bit lines according to the teachings of the present invention. the segmented bit lines allow the array to operate in a multiple port mode without requiring changes to the memory cell structure. As shown, memory array 50 can include one or more columns of sub arrays 52. In each column, sub arrays 52 are organized as odd and even sub arrays. According to the teachings of the present invention, each sub array 52 comprises a plurality of sub array segments 54 formed by segmenting the bit lines within each sub array 52. In the illustrated embodiment, each sub array 52 includes three sub array segments 54. In the illustrated embodiment, the bit lines are segmented by using bit line passgates 56 which provide controllable connections between the segments of the bit lines. It should be understood that other forms of controllable connections could also be used to segment bit lines.

As shown in FIGS. 4A and 4B, each sub array 52 has associated sense amplifier blocks 58. According to the present invention, the sense amplifier blocks 58 that are located within the interior of memory array 50 are controllably connected to either an even or an odd sub array 52 by sense amplifier passgates 60. According to the present invention, sense amplifier passgates 60 allow a particular sub array 52 to be serviced by one or two sense amplifier blocks 58.

As with the conventional structure shown in FIG. 2, each sense amplifier block receives a plurality of column select signals (YS) 62 for selecting a column within the selected sub array 52. Further, each sense amplifier block is coupled to a sub-amplifier 64. Unlike the structure of FIG. 2, sub-amplifiers 64 associated with even sub arrays 52 are controllably connected either to main amplifier 66 or a second main amplifier 68 used for dual port (DP) mode. Each odd sub-amplifier 64 is connected only to main amplifier 66 but each even sub-amplifier 64 is connected through transistor 70 or transistor 72 to main amplifier 66 or main amplifier 68. Transistors 70 and 72 can be controlled by a dual port control signal (DP) as shown.

Bit line passgates 56 can be controlled by control signals, X and Y, and sense amplifier passgates 60 can be controlled by control signals, A and B. As shown, the X control signal is provided to the upper bit line passgate 56 of each sub array 52 and the control signal Y is provided to the lower bit line passgate 56 of each sub array 52. The control signal A is provided to each set of sense amplifier passgates 60 associated with an even sub array 52, and the control signal B is provided to the sense amplifier passgate 60 associated with an odd sense amplifier block 58.

In a conventional single port operation, the control signals A and B can be set to connect each sense amplifier block 58 to the sub array 52 positioned below it. Further, the control signals X and Y can be asserted to connect the segments of the bit lines. Also, each even sub-amplifier 64 can be connected to main amplifier 56. With this setup, the memory array 50 operates in a conventional manner to allow single port read and write operations.

In order to allow dual port operation, the control signals X and Y are used to segment the bit lines in sub arrays 52. For example, the upper two sub array segments 54 can be connected together while the lower sub array segment 54 can be separated. In order to accomplish this, the upper bit line passgates 56 are used to connect the adjacent bit line segments, while the lower bit line passgates 56 are used to disconnect the adjacent bit line segments. Further, the control signals A and B can be used to connect a sense amplifier block positioned below the active sub array 52 to the bit lines in that active sub array 52. For example, if the word line is to be asserted in the upper sub array 52 shown in FIG. 4A, then the even sense amplifier block 58 below that sub array 52 can be connected upward to the sub array 52 using sense amplifier passgates 60.

As should be understood, the segmenting of bit lines within each sub array 52 allows separate operations to be conducted through the upper and lower sense amplifier block 58 adjacent to an active sub array 52 (the sub array in which a word line will be activated based upon the address). In order to accomplish this dual port functionality, two word lines within the same sub array 52 can be activated-one within one segment and one within the other segment. For example, a read can be accomplished using main amplifier 66 to the upper portion of a odd sub array 52 while a write operation could be accomplished to the lower portion of that sub array 52.

FIG. 5 is a table showing one embodiment of operation modes of the memory array 50 of FIGS. 4A and 4B. As shown, in normal operation, either a read or write can be accomplished to the segments of each sub array 52. In order to accomplish normal operation, the DP, A, B, X, Y, signals are set as shown. In this situation, the main amplifier 66 is used and allows a read or a write to be accomplished to the column of sub arrays within memory array 50.

In dual port operation, the active sub array can be either an odd or an even sub array as shown. With each odd or even sub array, a various combination of reads and writes can be attempted. The combinations shown comprise the various combinations of reading and writing to the segments within each sub array 52. In general, the control signals A and B are used to appropriately connect the sense amplifier blocks 58, and the control signals X and Y are used to appropriately connect the bit lines using bit line passgates 56. Although not shown, it should be understood that reading from both segments or writing to both segments could also be accomplished in which case the function for the main amplifiers in FIG. 5 would simply either all be read or all be write.

Thus, according to the present invention, bit lines within a memory array can be segmented to allow the formation of sub array segments that can then be separately operated within the same clock cycle. With appropriate connections of sense amplifiers and other data input/output structures to these memory array segments, the memory arrays can be operated in a dual or multiple port manner even though the essential structure of the memory array cells has not been changed. The change to the internal memory cell structure is the addition of rows of passgates to connect or disconnect segments of the bit lines. Of course other forms of controllable connections could be used in addition to passgates.

Although the present invention has been described in detail, it should be understood that various changes, substitutions and alterations could be made hereto without departing from the spirit and scope of the invention as defined by the appended claims.

What is claimed is:

1. A method of operating a memory array as a multiple port array, comprising:
    separating a bit line of the array into bit line segments by disconnecting the bit line segments from one another;
    connecting a first bank of sense amplifiers to a first bit line segment of the bit line;
    connecting a second bank of sense amplifiers to a second bit line segment of the bit line;
    performing a first operation to the first bit line segment using the first bank of sense amplifiers; and
    concurrently performing a second operation to the second bit line segment using the second bank of sense amplifiers.

2. The method of claim 1, wherein the first operation is a read operation and the second operation is a write operation.

3. The method of claim 1, wherein the first operation is a read operation and the second operation is a read operation.

4. The method of claim 1, wherein the first operation is a write operation and the second operation is a read operation.

5. The method of claim 1, wherein the first operation is a write operation and the second operation is a write operation.

6. The method of claim 1, wherein separating a bit line is accomplished using passgates.

7. The method of claim 1, wherein the bit line is separated into three bit line segments.

8. The method of claim 1, wherein connecting the first bank of sense amplifiers to the first bit line segment of the bit line is accomplished using passgates and wherein connecting the second bank of sense amplifiers to the second bit line segment of the bit line is accomplished using passgates.

9. The method of claim 1, wherein the memory array is part of a dynamic random access memory (DRAM).

10. The method of claim 1, wherein the memory array is part of a static random access memory (SRAM).

11. The method of claim 1, wherein the memory array is embedded in a processor device.

12. The method of claim 1, wherein the memory array is embedded in an ASIC device.

13. The method of claim 1, wherein the memory array is embedded in a controller device.

14. The memory array of claim 1, wherein the memory array is a sub array of a larger memory array area.

15. An integrated circuit device, comprising:
    a memory array having a plurality of sub arrays of memory cells,
        wherein the memory cells are selected by column select lines and row select lines, and selected memory cells are coupled to data terminals through bit lines and banks of sense amplifiers, and
        wherein each sub array is segmented into a plurality of sub array segments, each sub array segment containing one of a plurality of bit line segments of a bit line;
    a first plurality of banks of controllable connections, each bank of controllable connections is coupled between the bit line segments of each adjacent sub array segment, and
        wherein the controllable connections operate to connect or disconnect adjacent bit line segments responsive to control signals; and
    a second plurality of banks of controllable connections, wherein each bank of the second plurality of banks of controllable connections is coupled between a bank of sense amplifiers and sub arrays adjacent to the bank of sense amplifiers, and wherein the controllable connections of the second plurality of banks operate to connect or disconnect a bank of sense amplifiers and bit lines in adjacent sub arrays responsive to control signals;

such that the first and second plurality of banks of controllable connections allow the memory array to function in a dual port mode by connecting a first bank of sense amplifiers to first bit line segments of bit lines of an adjacent sub array and connecting a second bank of sense amplifiers to second bit line segments of the respective bit lines of the adjacent sub array, the second bit line segments being disconnected from the first bit line segments of the respective bit lines.

16. The integrated circuit device of claim 15, wherein the controllable connections in the first plurality of banks of controllable connections comprise passgates.

17. The integrated circuit device of claim 16, wherein each sub array is segmented into three sub array segments, and wherein the first plurality of banks of controllable connections comprises passgates connected between bitline segments of the same bit line in adjacent sub array segments.

18. The integrated circuit device of claim 15, wherein the controllable connections in the second plurality of banks of controllable connections comprise passgates.

19. The integrated circuit device of claim 15, wherein the integrated circuit device is a dynamic random access memory (DRAM) device.

20. The integrated circuit device of claim 19, wherein the column select lines comprise YS lines and the row select lines comprise word lines of the DRAM device.

21. A memory array having a plurality of memory cells selected by column select lines and row select lines, the selected memory cells are coupled to data terminals through bit lines and banks of sense amplifiers, the memory array comprising:

a plurality of word lines;
a plurality of bit lines, each bit line being divided into a plurality of bit line segments; and
a controllable connection coupled between adjacent bit line segments of each bit line, the controllable connection operating to connect or disconnect adjacent bit line segments responsive to control signals; and
wherein the controllable connections allow concurrent access to disconnected bit line segments of the same bit line in the memory array.

22. The memory array of claim 21, wherein the controllable connections in each bank of controllable connections comprise passgates.

23. The memory array of claim 21, wherein the bit lines are each segmented into three bit line segments, and wherein there are two banks of passgates separating the three bit line segments.

24. The memory array of claim 21, wherein the memory cells are dynamic random access memory (DRAM) cells.

25. The memory array of claim 24, wherein the column select lines comprise YS lines and the row select lines comprise word lines of the DRAM device.

26. The memory array of claim 21, wherein the memory array is a sub array of a larger memory array area.

27. The memory array of claim 21, wherein the memory cells are static random access memory (SRAM) cells.

28. The memory array of claim 21, wherein the array is embedded in a processor device.

29. The memory array of claim 21, wherein the array is embedded in an ASIC device.

30. The memory array of claim 21, further comprising:

a first sense amplifier coupled to a first bit line segment of the bit line;
a second sense amplifier coupled to a second bit line segment of the bit line disconnected from the first bit line segment.

31. The memory array of claim 30, wherein the first sense amplifier is located at one end of the bit line and the second sense amplifier is located at the opposite end of the bit line.

32. The memory array of claim 30, wherein the first and second sense amplifiers are operable to concurrently access the first and second bit line segments of the bit line.

33. An integrated circuit device comprising:

a memory array comprising:
a plurality of memory cells;
a plurality of bit lines, each bit line divided into a plurality of bit line segments;
a plurality of word lines;
a controllable connector connected between adjacent bit line segments of a bit line and operable to selectively connect or disconnect the adjacent bit line segments from one another;
a first sense amplifier coupled to a first bit line segment of the bit line;
a second sense amplifier coupled to a second bit line segment of the bit line disconnected from the first bit line segment; and
wherein the first sense amplifier and the second sense amplifier are operable to access separate bit line segments of the same bit line.

34. The integrated circuit of claim 33, wherein the first sense amplifier is located adjacent to one end of the bit line and the second sense amplifier is located adjacent to the opposite end of the bit line.

35. The integrated circuit device of claim 33, wherein the memory array is a sub array of a larger memory array area.

36. The integrated circuit device of claim 33, further comprising a controllable between each of the first and second sense amplifiers and the bit line.

37. The integrated circuit device of claim 33, wherein the controllable connector comprises a passgate.

38. The integrated circuit device of claim 36, wherein the controllable connector connected between each of the first and second sense amplifiers and the bit line comprises a passgate.

39. The integrated circuit device of claim 33, wherein the first and second sense amplifiers access the separate bit line segments of the same bit line concurrently.

40. The integrated circuit device of claim 33, further comprising a main amplifier coupled to an output of the first sense amplifier.

41. The integrated circuit device of claim 40, wherein the main amplifier is also coupled to an output of the second sense amplifier.

42. The integrated circuit device of claim 41, further comprising a second main amplifier; and wherein the second main amplifier is selectively connected to the output of the second sense amplifier when the first and second sense amplifiers are accessing the bit line concurrently; and
wherein the first main amplifier is selectively disconnected from the output of the second sense amplifier when the first and second sense amplifiers are accessing the bit line concurrently.

43. The integrated circuit device of claim 33, wherein the memory array is a dynamic random access memory (DRAM) array.

44. The integrated circuit device of claim 33, wherein the memory array is a static random access memory (SRAM) array.

45. The integrated circuit device of claim 33, wherein the integrated circuit device is a processor device.

46. The integrated circuit device of claim 33, wherein the integrated circuit device is an ASIC device.

47. The integrated circuit device of claim 33, wherein the integrated circuit device is a controller device.

* * * * *